US010107625B2

(12) United States Patent
Bhandari et al.

(10) Patent No.: US 10,107,625 B2
(45) Date of Patent: *Oct. 23, 2018

(54) INTEGRATED INERTIAL SENSING DEVICE

(71) Applicant: mCube Inc., San Jose, CA (US)

(72) Inventors: Sanjay Bhandari, San Jose, CA (US);
Ali J. Rastegar, San Jose, CA (US);
Sudheer S. Sridharamurthy, San Jose,
CA (US)

(73) Assignee: mCube Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/442,488

(22) Filed: Feb. 24, 2017

(65) Prior Publication Data
US 2017/0167875 A1 Jun. 15, 2017

Related U.S. Application Data

(63) Continuation-in-part of application No. 14/158,765, filed on Jan. 17, 2014, now Pat. No. 9,612,119.
(Continued)

(51) Int. Cl.
G01P 3/00 (2006.01)
G01C 19/5712 (2012.01)
(Continued)

(52) U.S. Cl.
CPC .......... G01C 19/5712 (2013.01); B81B 7/008 (2013.01); B81B 7/02 (2013.01); B81B 2201/0242 (2013.01)

(58) Field of Classification Search
CPC ............ G01C 19/5712; G01C 19/5762; B81B 7/008; B81B 7/02; B81B 2201/0242
(Continued)

(56) References Cited

U.S. PATENT DOCUMENTS 8,714,012 B2   5/2014 Caminada et al.
9,146,109 B2   9/2015 Magnoni et al.
(Continued)

FOREIGN PATENT DOCUMENTS

JP   2012112748 A    6/2012
TW    201029321 A1   8/2010
(Continued)

OTHER PUBLICATIONS

J Cui, X Z Chi, H T Ding, LT Lin, Z C Yang and G Z Yan, Title: Transient response and stability of the AGC-PI closed-loop controlled MEMS vibratory gyroscopes, Date: Nov. 5, 2009, Publisher: IOP Publishing, Journal of Micromechanics and Microengineering, 19 (2009) 125015, pp. 17.
(Continued)

Primary Examiner — Lisa Caputo
Assistant Examiner — Roger Hernandez-Prewit
(74) Attorney, Agent, or Firm — Kilpatrick Townsend & Stockton LLP

(57) ABSTRACT

A CMOS IC substrate can include sense amplifiers, demodulation circuits and AGC loop circuit coupled to the MEMS gyroscope. The AGC loop acts in a way such that generated desired signal amplitude out of the drive signal maintains MEMS resonator velocity at a desired frequency and amplitude. The system can include charge pumps to create higher voltages as required in the system. The system can incorporate ADC to provide digital outputs that can be read via serial interface such as I2C. The system can also include temperature sensor which can be used to sense and output temperature of the chip and system and can be used to internally or externally compensate the gyroscope sensor measurements for temperature related changes. The CMOS IC substrate can be part of a system which can include a
(Continued)

MEMS gyroscope having a MEMS sensor overlying the CMOS IC substrate.

26 Claims, 3 Drawing Sheets

Related U.S. Application Data

(60) Provisional application No. 61/755,450, filed on Jan. 22, 2013, provisional application No. 61/755,451, filed on Jan. 22, 2013.

(51) Int. Cl.
*B81B 7/02* (2006.01)
*B81B 7/00* (2006.01)

(58) Field of Classification Search
USPC ............................................. 73/497
See application file for complete search history.

(56) References Cited

U.S. PATENT DOCUMENTS

| | | |
|---|---|---|
| 9,541,396 B2 | 1/2017 | Bhandari |
| 9,612,119 B2 | 4/2017 | Bhandari et al. |
| 2008/0000296 A1* | 1/2008 | Johnson ............ G01C 19/5719 73/514.18 |
| 2010/0307241 A1 | 12/2010 | Raman et al. |
| 2011/0197674 A1 | 8/2011 | Prandi et al. |
| 2012/0096942 A1 | 4/2012 | Hayashi et al. |
| 2012/0234093 A1 | 9/2012 | Black et al. |
| 2013/0104652 A1 | 5/2013 | Cazzaniga et al. |

FOREIGN PATENT DOCUMENTS

| | | |
|---|---|---|
| TW | 201243280 A1 | 11/2012 |
| TW | 201435304 A | 9/2014 |

OTHER PUBLICATIONS

Milap Dalal, Title: Low Noise, Low Power Interface Circuits and Systems for High Frequency Resonant Micro-Gyroscopes, Date: Aug. 2012, Publisher: Georgia Institute of Technology, pp. total: 194.
Office Action received in Taiwanese Patent Application No. TW103102353, filed Jan. 22, 2014. Dated Feb. 10, 2015. 9 pages.
Notice of Allowance received in Taiwanese Patent Application No. TW103102353, filed Jan. 22, 2014. Dated Aug. 25, 2015. 3 pages. No translation available.
Non-Final Office Action received in U.S. Appl. No. 14/160,549, filed Jan. 21, 2014. Dated Oct. 26, 2015. 15 pages.
Final Office Action received in U.S. Appl. No. 14/158,765, filed Jan. 17, 2014. Dated Mar. 15, 2016. 11 pages.
Final Office Action received in U.S. Appl. No. 14/160,549, filed Jan. 21, 2014. Dated May 12, 2016. 12 pages.
Non-Final Office Action received in U.S. Appl. No. 14/158,765, filed Jan. 17, 2014. Dated Jul. 8, 2016. 11 pages.
Notice of Allowance received in U.S. Appl. No. 14/160,549, filed Jan. 21, 2014. Dated Sep. 7, 2016. 9 pages.
Notice of Allowance received in U.S. Appl. No. 14/158,765, filed Jan. 17, 2014. Dated Nov. 23, 2016. 10 pages.

* cited by examiner

INTEGRATED INERTIAL SENSING DEVICE

CROSS-REFERENCES TO RELATED APPLICATIONS

The present application is a continuation-in-part application of U.S. application Ser. No. 14/158,765, filed Jan. 17, 2014, which claims priority to U.S. Provisional App. 61/755, 450, filed Jan. 22, 2013, and U.S. Provisional App. 61/755, 451, filed Jan. 22, 2013, commonly owned, and the content of all of which is incorporated by reference, for all purposes.

BACKGROUND OF THE INVENTION

The present invention is directed to MEMS (Micro-Electro-Mechanical-Systems). More specifically, embodiments of the invention provide methods and structure for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

The present invention is directed to MEMS (Micro-Electro-Mechanical-Systems). More specifically, embodiments of the invention provide a system having an integrated MEMS gyroscope architecture. Embodiments described herein will cover various aspects for specific applications, but it will be recognized that the invention has a much broader range of applicability.

The present invention includes a device architecture for an integrated MEMS gyroscope system. This system architecture includes a MEMS block, which can be a single or multi-axis MEMS gyroscope element. The sensing element is shown as capacitive but other sensing elements are also possible and the first amplifier interfacing with the MEMS element is designed appropriately. The MEMS gyroscope can include sense capacitors coupled to a sense path and drive feedback capacitors coupled to a drive path.

The gyroscope has a drive element that needs to resonate continuously at desired frequency and amplitude. To maintain this oscillation of MEMS element, the system includes a rectifier, comparator, Proportional-Integral-Derivative (PID) controller driver, which forms an Automatic Gain Control (AGC) loop, according to an embodiment of the present invention. The driver shown as High Voltage (HV) in the architecture is ac or pulse voltage drive and can be low voltage (LV) or High Voltage (HV). Hereafter, we refer to the driver as HV driver but it may be implemented as low voltage driver. The drive feedback capacitors of the MEMS gyroscope can be coupled to a charge-sense-amplifier (CSA), which is coupled in series to a 90 degrees phase shifter (PS) and to the rectifier.

In an embodiment, the system can also include a mixer configured as a transmission gate that is coupled to the MEMS gyroscope. A circuit loop including a digital low-pass-filter (LPF) coupled to a digital/analog converter (DAC) can also be coupled to the mixer. In a specific embodiment, a temperature sensor can be configured with a phase shifter (PS) to compensate for phases changes due to temperature. The system architecture can also include a test mode that allows measurement of quadrature signal using blocks QD, comparator and multiplexer.

When the MEMS drive resonator generates signal at lower amplitude than desired, the amplitude of the rectified signal from the CSA, used for processing signal from drive path as well as the sense path of the gyroscope, is smaller compared to the reference signal provided to the PID. The PID block generates output in Proportion to the difference of the input signals. The output of the PID block drives the charge pump. Output of PID block will be proportional to the difference in reference voltage input to the PID and the rectified signal amplitude. If output of PID is higher, then charge will provide larger voltage output.

The charge pump powers the HV driver block. If charge pump output is higher, the HV driver outputs proportionally higher amplitude pulses which will inject more Force, proportional to product of dc and ac voltage output from HV driver, in to MEMS driver-resonator. The displacement generated by the resonator is proportional to the input force and the Q of the resonator. E.g. larger the Q, larger is the displacement. Also, for a given Q, larger the force, larger is the displacement of MEMS drive element. Larger displacement of MEMS element generates larger signal (for example as capacitance change). Thus, the AGC loop acts in a way that generated desired signal amplitude out of the drive signal and equivalently, maintains MEMS resonator velocity as desired frequency and amplitude.

One of the benefits of proposed system architecture is that the charge pump, inherently includes a 'time constant' for charging up of its output voltage. This incorporates the Low pass functionality in to the AGC loop without requiring additional circuitry. Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to MEMS (Micro-Electro-Mechanical-Systems). More specifically, embodiments of the invention provide a system having an integrated MEMS gyroscope architecture. Embodiments described herein will cover various aspects for specific applications, but it will be recognized that the invention has a much broader range of applicability.

Figure 1:
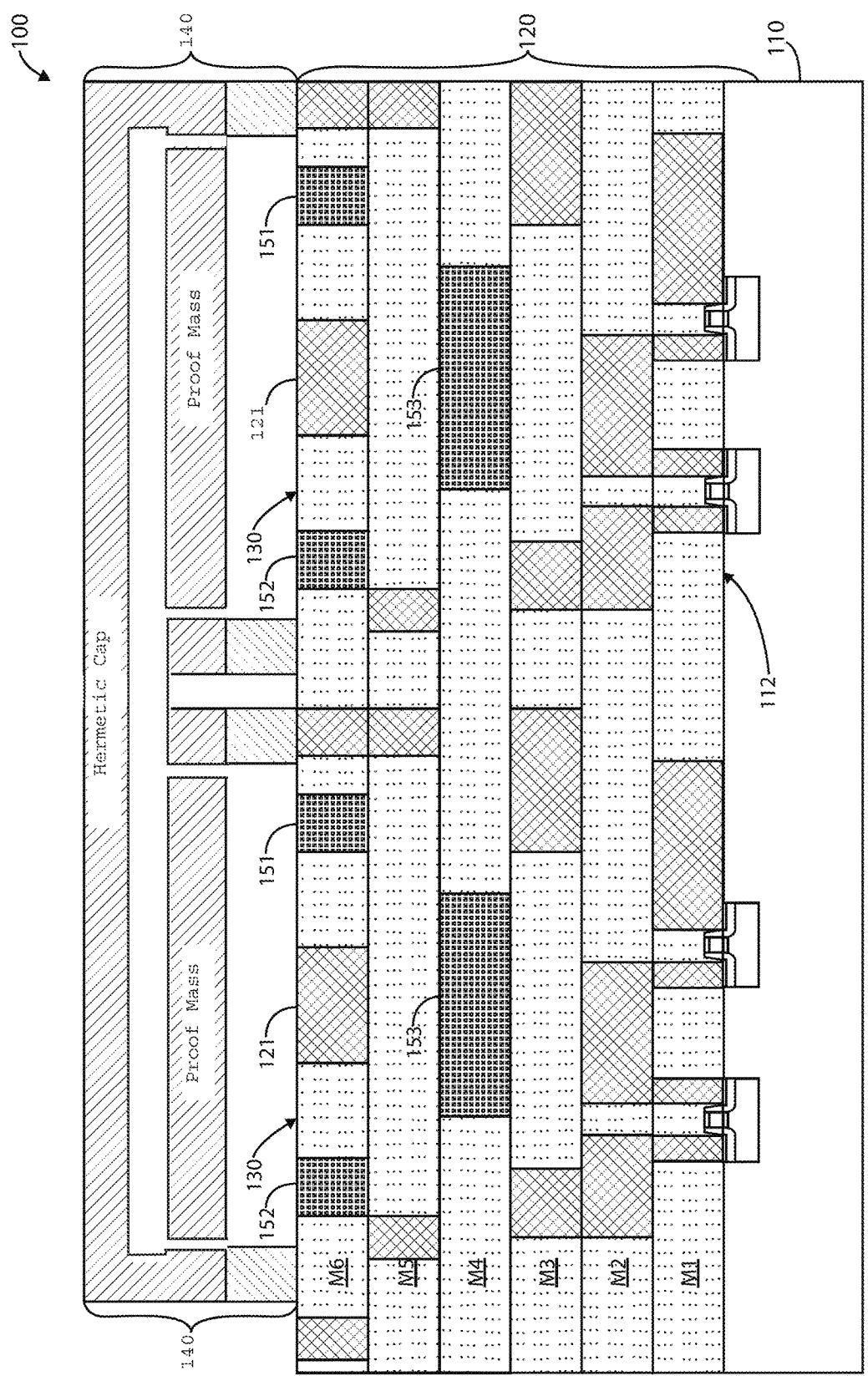
FIG. 1 is a simplified diagram illustrating a cross-sectional view of an integrated MEMS gyroscope device according to an embodiment of the present invention.

FIG. 1 is a simplified diagram illustrating a cross-sectional view of an MEMS gyroscope device according to an embodiment of the present invention. The integrated MEMS gyroscope device 100 includes a substrate 110 having a surface region 112, and a CMOS layer 120 overlying surface region 112 of substrate 110. CMOS layer 120 has a CMOS surface region 130. In some embodiments, CMOS layer 120 can include processed CMOS devices in substrate 110 and can including multilevel metal interconnect structures. The example shown in FIG. 1 includes six metal layers, M1-M6. The integrated MEMS gyroscope device 100 also includes a MEMS gyroscope 140 overlying the CMOS surface region, and includes an out-of-plane sense plate 121. Integrated MEMS gyroscope device 100 also includes metal shielding within a vicinity of the MEMS device configured to reduce parasitic effects. In the example of FIG. 1, metal regions 151 and 152 are shields on the sides of the plate, while 153 is the shield below the plate on metal 4. Those of ordinary skill in the art will recognize other variations, modifications, and alternatives.

Figure 2:
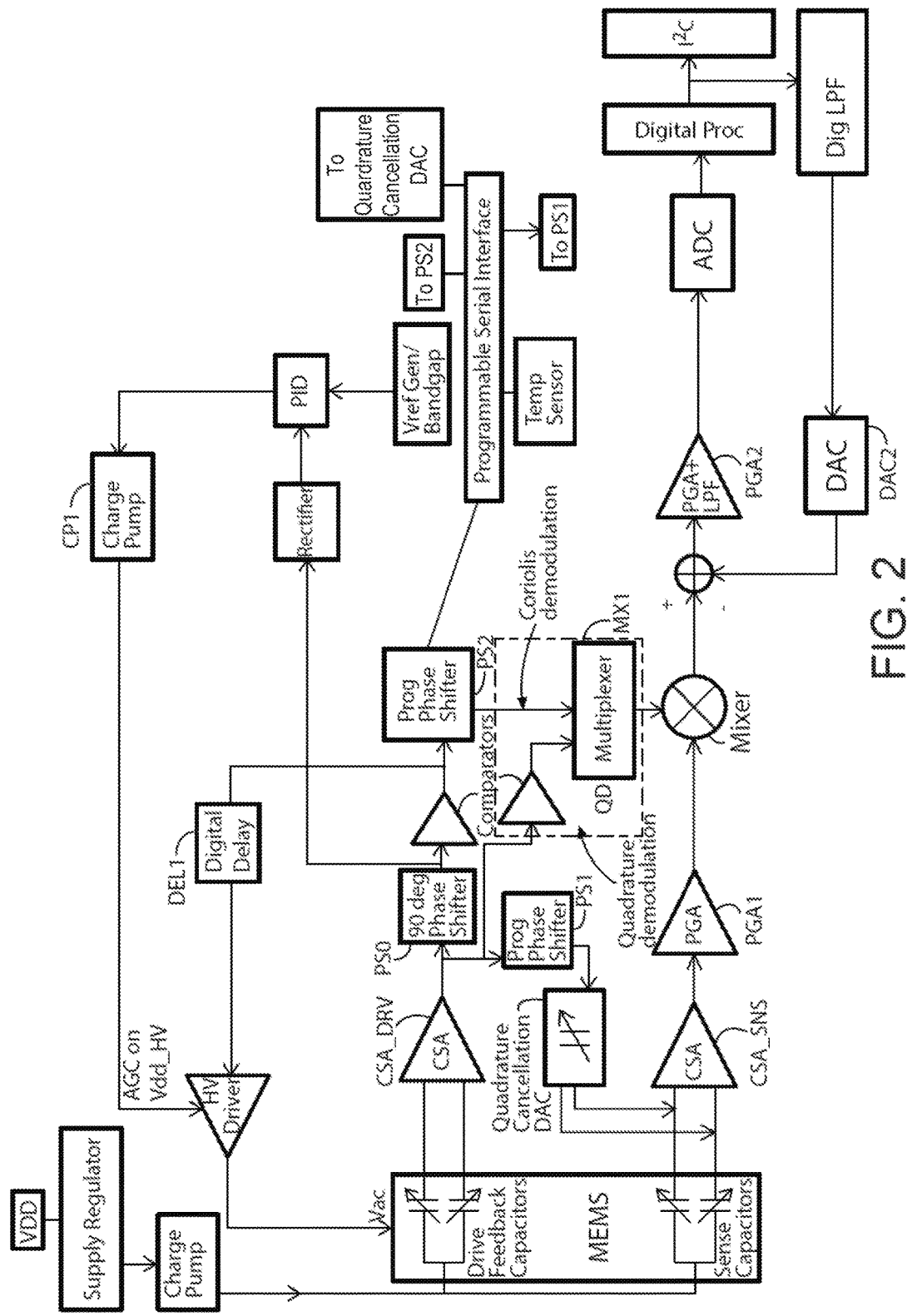
FIG. 2 is a simplified block diagram illustrating a system having an integrated MEMS gyroscope architecture according to an embodiment of the present invention.

FIG. 2 is a simplified block diagram illustrating a system having an integrated MEMS gyroscope architecture according to an embodiment of the present invention. Some included components are the Charge Sense Amplifiers (CSA), Programmable Gain Amplifier (PGA), Low Pass Filter (LPF), I2C. The CSAs is used for processing signals from the drive path as well as sense path of a Gyroscope or other MEMS inertial sensing device. The I2C is a serial bus communication to digital registers on the chip.

The MEMS block shown in FIG. 1 is a single or multi-axis MEMS gyroscope element. The sensing element is shown as capacitive but other sensing elements are also possible and the first amplifier interfacing with the MEMS element is designed appropriately.

The gyroscope has a drive element that needs to resonate continuously at desired frequency and amplitude. To maintain this oscillation of MEMS element, the drive loop includes a first Charge Sense Amplifier (CSA_DRV), a first phase shifter (PS0), a first comparator, and an high-voltage (HV) driver coupled in series in a loop. The first Charge Sense Amplifier is coupled to the first phase shifter, the first phase shifter is coupled to the first comparator, and the first comparator is coupled to the high-voltage driver. The drive loop provides gain of signal at desired frequency of oscillation. The CSA_DRV senses the change in capacitance due to drive element and converts it in to voltage signal.

In order to provide in-phase feedback signal, a 90 degree phase shifter, PS0, is added in the drive loop. The 90 degree phase shift can be implemented as differentiator or integrator or other known techniques.

The Rectifier, comparator, Proportional-Integral-Derivative (PID) controller, High Voltage (HV) driver form an Automatic Gain Control (AGC) loop. The AGC loop circuit including, the first comparator, a rectifier, a proportional-integral-derivative (PID) controller, the high-voltage (HV) driver, and a charge pump coupled in series in a loop, wherein an input of the first comparator is coupled to the rectifier and an output of the first comparator is coupled to the HV driver, the rectifier is coupled to the PID controller, the PID controller is coupled to the charge pump, and the charge pump is coupled to the high-voltage driver. When the MEMS drive resonator generates signal at lower amplitude than desired, the amplitude of the rectified signal from the CSA, used for processing signal from drive path as well as sense path of Gyroscope, is smaller compared to the reference signal provided to the PID. The PID block generates output in Proportion to the difference of the input signals. The output of the PID block drives the charge pump. Output of PID block will be proportional to the difference in reference voltage input to the PID and the rectified signal amplitude. If output of PID is higher, then charge will provide larger voltage output.

The charge pump powers the HV driver block. If charge pump output is higher, the HV driver outputs proportionally higher amplitude pulses which will inject more Force, proportional to product of dc and ac voltage output from HV driver, in to MEMS driver-resonator. In a specific embodiment, the HV driver can be implemented as a simple digital gate. The power supply to the HV driver can be controlled using a charge pump CP1, which effectively provides automatic gain controlled ac pulses to the Gyro resonator. The HV driver can also be replaced by a conventional external supply (VDD) at any desired voltage, such as 1.8V or others.

The displacement generated by the resonator is proportional to the input force and the Q of the resonator. E.g. larger the Q, larger is the displacement. Also, for a given Q, larger the force, larger is the displacement of MEMS drive element. Larger displacement of MEMS element generates larger signal (for example as capacitance change). Thus, the AGC loop acts in a way that generated desired signal amplitude out of the drive signal and equivalently, maintains MEMS resonator velocity as desired frequency and amplitude.

The PID block also provide a differential signal, which is necessary for kick-start of the AGC loop in order to pump up the charge pump output faster especially during power on. In the normal mode, an integrator integrates the output of PID so that noise pulses do not cause undesired changes in the AGC path and makes the steady state error to be zero.

The rectifier, comparator, Proportional-Integral-Derivative (PID) controller, High Voltage (HV) driver, MEMS resonator, CSA_DRV and the 90 degree phase shifter, PS0, form an Automatic Gain Control (AGC) loop. When the MEMS drive resonator generates signal at lower amplitude than desired, the amplitude of the rectified signal from the CSA is smaller compared to the reference signal provided to the PID. The PID block generates output in proportion to the difference of the input signals. The output of the PID block controls the gain of the HV driver, which decides the amplitude of the ac voltage, Vac, driving the MEMS resonator.

By driving the MEMS drive capacitors with an AC voltage that is of low impedance, dependence of the AGC loop performance on MEMS leakage can be substantially eliminated. The displacement generated by the resonator is proportional to the input force and the Q of the resonator. E.g. larger the Q, larger is the displacement. Also, for a given Q, the larger the force, the larger is the displacement of MEMS drive element. Larger displacement of the MEMS element generates a larger signal (for example as capacitance change). Thus, the AGC loop acts in a way that generates a desired signal amplitude out of the drive signal and equivalently, maintains MEMS resonator velocity as desired frequency and amplitude.

In a specific embodiment, the sensing mechanism of the gyroscope is based on a Coriolis force, which is proportional to the vector product of angular rate of the gyroscope and the velocity of the MEMS driver resonator. The Coriolis force generates a displacement of the MEMS sense element in a direction that is orthogonal to the drive velocity and the external angular rate. The displacement signal is sensed via a sense Charge Sense Amplifier (CSA_SNS). The signal at the output of the sense CSA will have a carrier signal at the frequency of the resonance of the drive resonator, which will be amplitude modulated by a signal proportional to the angular rate of motion.

The drive signal also gets injected in the sense path and is 90 degrees out of phase compared to the Coriolis displacement, and hence is termed "Quadrature coupling". A programmable Quadrature cancellation DAC is an array of programmable capacitors that allow a desired portion of the quadrature signal to be cancelled from the input signal. In addition, to accurately cancel the quadrature, which may have a different phase than 90 deg, a phase shifter PS1 is used in the present architecture embodiment.

FIG. 1 also shows a sense path having a second Charge Sense Amplifier (CSA_SNS), a first Programmable Gain Amplifier (PGA1), a mixer, a second Programmable Gain Amplifier (PGA2), a Low Pass Filter (LPF), an A/D converter (ADC), and digital processing circuits, wherein the second Charge Sense Amplifier is coupled to the first Programmable Gain Amplifier, the first Programmable Gain Amplifier is coupled to the mixer, the mixer is coupled to the second Programmable Gain Amplifier, the second Programmable Gain Amplifier is coupled to the Low Pass Filter, the Low Pass Filter is coupled to the A/D converter, and the A/D converter is coupled to the digital processing circuits. The CSA-sense (CSA_SNS) is a low noise amplifier with capacitive feedback. In order to maintain DC biasing at the amplifier input, a very high impedance feedback at low frequency is required. In various embodiments of the present invention, this configuration is realized by using MOS transistors operating in a sub-threshold region that can create impedances in the order of Giga-ohms. The feedback to maintain input common voltage is only desired at DC. In order to ensure little impact of the high impedance common mode feedback and to minimize noise impact at high frequency, a very low cut-off frequency low pass filter is added in the feedback path.

The Programmable Gain Amplifier 1 (PGA1) amplifies the signal from CSA_SNS to a desired level. The rate signal needs to be demodulated from the signal at the output of sense CSA. The mixer in the signal path achieves the demodulation by mixing the carrier signal coming out from the drive CSA with the composite signal coming from the sense-CSA amplified by the PGA.

In a specific embodiment, the mixer is implemented as a transmission gate. One input of the transmission gate is the pulse coming from the comparator after going through the programmable phase shifter PS2. Phase Shifter PS2 shifts pulses by a programmable amount from −180 deg to +180 deg thereby adjusting for both phase lead and lag between signal in drive loop verses signals in sense path.

In a specific embodiment, temperature compensation can be achieved by programming phase shifters PS1 and PS2 to be driven through a programmable serial interface based on temperature measured using an on-chip temperature sensor. Doing so will result in a demodulation and quadrature cancellation that is optimized with temperature. In another embodiment, temperature compensation loop for gyroscope that involves, reading chip temperature using on-chip Temp sensor via interface such as I2C. Processing of the temperature change can be done externally through software or hardware processor to come up with optimal correction that can be programmed back in to the chip using interface circuits such as I2C. There are some circuits in the Gyroscope that may exhibit temperature dependence. Furthermore, the temperature dependence may or may not linear and may not be correlated to variation of certain blocks. For example, the MEMS quadrature phase may vary with temperature. The phase shifter delays also may vary with temperature. Having temperature sensor on the same chip allows to provide measurement in time synchronization with gyroscope measurement. By modelling how phase shifter delay varies with temperature, a control logic or software can program appropriate change in the phase shifter to compensate for its temperature variation. Similarly, temperature dependence of other key blocks such as quadrature can be compensated by initially modeling the variation and then by using a look up table or software algorithms to compensate for the dependence. The variations in gyroscope output due to temperature can thus be minimized with such a temperature compensation system. In some embodiments, a circuit block internal to the CMOS and MEMS chip or a system software external to the chip is configured to process the gyroscope measurement and temperature measurement and is configured to program phase delay PS1 and/or PS2, Quadrature cancellation DAC, and Digital processing circuits for temperature compensation.

The Programmable Gain Amplifier PGA2 amplifies the demodulated rate signal. PGA2 also includes a Low Pass Filtering function. An embodiment of the present invention includes a LPF by simply adding a capacitor in the feedback path of the PGA2. Since the carrier component is suppressed with the LPF in the PGA2, the dynamic range can be effectively used for desired rate signal amplification before converting to a digital domain.

A small phase shift with respect to 90 degrees may exist in the CSA drive, which will generate DC or low frequency components after demodulation, thereby consuming dynamic range after the mixer. According to a specific embodiment, a programmable phase shifter, PS2, can be configured within the architecture to effectively cancel this component. The PS coupled to the comparator can be used to adjust the phase difference optimally to compensate for analog phase shifts and cancel out unwanted component of carrier (resonant) frequency.

According to another specific embodiment, a loop including or consisting of a digital low pass filter and DAC2 can be provided within the architecture. This loop cancels a small offset or low frequency component that may exist in the signal path due to offsets of analog blocks or DC or low frequency components produced by the mixer that is not in the range of rate signal frequency.

A high resolution (e.g. 16 bit) A/D converter (ADC) converts the demodulated rate signal. The A/D converter has inputs for multiple channels in order to multiplex the digital signal path for all of the channels. One of the inputs of the A/D converter is from the on-chip temperature sensor. The Temp sensor output can be effectively used to compensate for the effect of the resonator variation with temperature either in the analog or digital domain. In an embodiment, the temperature sensor output can be read and used to program the phase shifter PS2 to compensate for changes in phase occurring due to changes in temperature. Temperature compensation can also be applied in the digital path with certain programmability. Also, multiple axes (e.g. three axis for a 3 degrees of freedom (3DOF) Gyro) of the Gyro signal are multiplexed at the ADC.

The digital path can have signal processing such as programmable Low Pass Filters to cancel noise outside of a band of interest. The digital signal path also has a programmable High Pass Filter (HPF) to substantially eliminate DC components, offset, or very low frequency artifacts that are not within the expected rate signal band. In a specific embodiment, the programmable HPF can be configured at a frequency using the DAC (DAC2) and a digital LPF in feedback configuration.

The system architecture of FIG. 2 also shows a test mode that allows measurement of quadrature signal using blocks QD, comparator and multiplexer. In this embodiment, a voltage corresponding to the drive displacement is used to demodulate the signal form the MEMS sense capacitors. This mode is multiplexed with the 'normal' mode in which the voltage corresponding to the drive velocity is used to demodulate the signal from the MEMS sense capacitors. The quadrature mode provides a method to quantify the residual 'feed-through' or 'quadrature' signal from the MEMS drive capacitors to the sense capacitors, and to observe how it varies with ambient parameters such as temperature, humidity, etc.

In a specific embodiment, a digital delay, using block DELL is introduced in the frequency control loop of the drive servo. Varying the delay causes the loop to lock into different frequencies. For instance, the delay can be varied to make the loop lock into the 3-dB frequencies of the MEMS drive resonator and measure the 3 dB bandwidth and quality factor.

Figure 3:
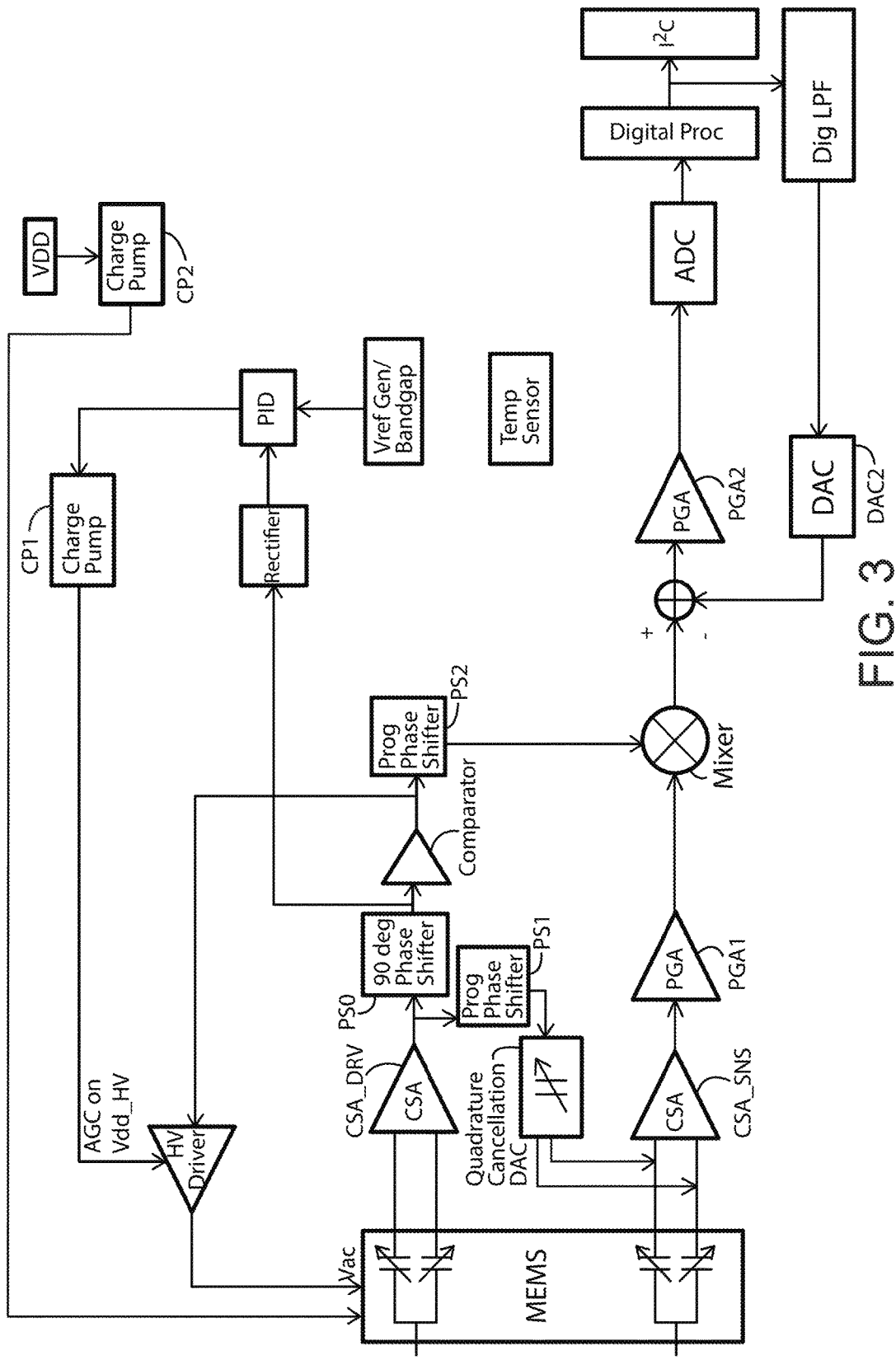
FIG. 3 is a simplified block diagram illustrating a system having an integrated MEMS gyroscope architecture according to an embodiment of the present invention.

FIG. 3 is a simplified block diagram illustrating a system having an integrated MEMS gyroscope architecture according to another embodiment of the present invention. Similar to FIG. 2, the MEMS block shown in FIG. 3 is single or multi-axis MEMS gyroscope element. The sensing element is shown as capacitive but other sensing elements are also possible and the first amplifier interfacing with the MEMS element is designed appropriately. Several of the components discussed for FIG. 2 are also present in the embodiment depicted by FIG. 3. Thus, further information regarding of these components can be found in the previous descriptions.

One of the benefits of proposed AGC loop is that the charge pump, inherently includes a 'time constant' for charging up of its output voltage. This incorporates the Low pass functionality in to the AGC loop without requiring additional circuitry.

The HV driver can be either analog HV amplifier or simple inverter. The supply voltage of HV driver is provided from charge pump CS1 and provides one means of controlling the output amplitude from HV driver.

An additional charge pump, CS2, is designed to allow external power supply voltage CP2 that can be lower compared to on-chip voltages. For example, the external power can be 1.8V and internal voltages can be 3.3V and much higher voltages at charge pump for HV driver.

The multiple charge pump architecture allows more efficient usage of power. For example, the boosting of external supply voltage 1.8V may have to be boosted to 32V. This can be done as boost from 1.8V to 3.3V and from 3.3V to 32V. This feature will allow usage of device at higher voltage to bypass one of the charge pumps CS2.

The layout of the Gyroscope MEMS and CMOS is very critical to achieve optimal performance. All the out of plane sense signal plates are shielded with metal shield on sides (on same metal layer) as well as on layers below the sense plates. In a specific embodiment, a shield may be placed by skipping one or more metal layers to minimize parasitic capacitance. For example, if sense plate is on metal 6, the shield may be on metal 4 instead of metal 5 in order to provide more isolation & reduce parasitics. An example is shown in FIG. 1, which shows that CMOS layer 120 can include processed CMOS devices (not shown) in substrate 110 and can including multilevel metal interconnect structures, e.g., six metal layers, M1-M6. The integrated MEMS gyroscope device 100 also includes a MEMS gyroscope 140 overlying the CMOS surface region, and includes an out-of-plane sense plate 121. Metal regions 151 and 152 are shields on the sides of the plate in the metal 6 layer, while 153 is the shield below the plate on the metal 4 layer.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system comprising a CMOS IC layer having a CMOS surface region, the CMOS IC layer including:
   a drive loop, the drive loop including a first Charge Sense Amplifier (CSA_DRV), a first phase shifter (PS0), a first comparator, and an high-voltage (HV) driver coupled in series in a loop, wherein the first Charge Sense Amplifier is coupled to the first phase shifter, the first phase shifter is coupled to the first comparator, and the first comparator is coupled to the high-voltage driver;
   an Automatic Gain Control (AGC) loop circuit, the AGC loop circuit including, the first comparator, a rectifier, a proportional-integral-derivative (PID) controller, the high-voltage (HV) driver, and a charge pump coupled in series in a loop, wherein an input of the first comparator is coupled to the rectifier and an output of the first comparator is coupled to the HV driver, the rectifier is coupled to the PID controller, the PID controller is coupled to the charge pump, and the charge pump is coupled to the high-voltage driver; and a sense path having a second Charge Sense Amplifier (CSA_SNS), a first Programmable Gain Amplifier (PGA1), a mixer, a second Programmable Gain Amplifier (PGA2), a Low Pass Filter (LPF), an A/D converter (ADC), and digital processing circuits, wherein the second Charge Sense Amplifier is coupled to the first Programmable Gain Amplifier, the first Programmable Gain Amplifier is coupled to the mixer, the mixer is coupled to the second Programmable Gain Amplifier, the second Programmable Gain Amplifier is coupled to the Low Pass Filter, the Low Pass Filter is coupled to the A/D converter, and the A/D converter is coupled to the digital processing circuits.

2. The system of claim 1 further comprising a MEMS inertial sensing device overlying a CMOS surface region, the MEMS inertial sensing device electrically coupled to the drive loop and the sense path, the MEMS inertial sensing device electrically coupled to the AGC loop circuit through the drive loop.

3. The system of claim 2 wherein the mixer coupled to an amplified sense signal and a phase adjusted drive signal is configured as a transmission gate.

4. The system of claim 2 further comprising a metal shielding within a vicinity of the MEMS inertial sensing device.

5. The system of claim 1 further comprising a circuit loop consisting of a digital low-pass-filter (LPF) coupled to a digital/analog converter (DAC), the circuit loop being coupled to the mixer.

6. The system of claim 1 further comprising a programmable phase-shifter coupled to the comparator to adjust a phase difference optimally to compensate for analog phase shifts.

7. The system of claim 6 further comprising a temperature compensation loop including an on-chip temperature sensor coupled to a programmable serial interface.

8. The system of claim 1 wherein the charge pump is a first charge pump, and the system further comprises a second charge pump, wherein the first and second charge pumps are configured to enable operation of the system at voltages higher than an available supply voltage.

9. A system comprising a CMOS IC layer having a CMOS surface region, the CMOS IC layer having an Automatic Gain Control (AGC) loop circuit, the AGC loop circuit including:
a rectifier,
a comparator,
a proportional-integral-derivative (PID) controller,
a charge pump,
a high-voltage (HV) driver,
a drive charge-sense-amplifier (CSA), and
a 90 degrees phase shifter;
wherein an output of the CSA is coupled to the 90 degree phase shifter, an output of the 90 degree phase shifter is coupled to an input of the comparator and is also coupled to the rectifier, an output of the comparator is coupled to the HV driver;
wherein the PID controller receives an output from the rectifier and a reference signal and generates an output in proportion to the difference of its input signals, and provides an output to control the gain of the HV driver;
wherein the an input of the charge pump is coupled to an output of the PID and an output of the charge pump is coupled to the HV driver.

10. The system of claim 9, further comprising a MEMS inertial sensing device overlying the CMOS surface region, the MEMS inertial sensing device electrically coupled to the AGC loop circuit.

11. The system of claim 10 further comprising a mixer coupled to the MEMS inertial sensing device, wherein the mixer is configured as a transmission gate.

12. The system of claim 10 wherein the comparator is a first comparator, and further comprising a quadrature mode circuit including a second comparator and a multiplexer, wherein the quadrature mode circuit is configured to monitor a quadrature signal from the MEMS inertial sensing device.

13. The system of claim 10 further comprising metal shielding within a vicinity of the MEMS inertial sensing device, the metal shielding being configured to reduce parasitic effects.

14. The system of claim 9 further comprising a circuit loop including a digital low-pass-filter (LPF) coupled to a digital/analog converter (DAC), the circuit loop being coupled to the mixer or PGA2 to effectively cancel dc offset or low frequency undesired artifacts.

15. The system of claim 9 further comprising a programmable high-pass-filter (HPF) having a cut off frequency implemented using a DAC and a digital LPF in a feedback configuration.

16. The system of claim 9 further comprising a digital delay module coupled to the comparator and the HV driver, the digital delay module being configured to lock into a desired frequency.

17. A system comprising an CMOS IC layer, the CMOS IC layer including:
an Automatic Gain Control (AGC) loop circuit, the AGC loop circuit including a rectifier, a comparator, a proportional-integral-derivative (PID) controller, a high-voltage (HV) driver, a drive charge-sense-amplifier (CSA_DRV), and a 90 degrees phase shifter, and a charge pump, wherein an output of the CSA_DRV is coupled to the 90 degree phase shifter, an output of the 90 degree phase shifter is coupled to an input of the comparator and is also coupled to the rectifier, an output of the comparator is coupled to the HV driver, the PID controller receives an output from the rectifier and a reference signal and generates an output in proportion to the difference of its input signals, and provide an output to control the gain of the HV driver; and a sense path having a sense Charge Sense Amplifier (CSA_SNS), a Programmable Gain Amplifier (PGA1), a mixer, another Programmable Gain Amplifier (PGA2), a Low Pass Filter (LPF), an A/D converter (ADC), and digital processing circuits,
wherein the second Charge Sense Amplifier is coupled to the first Programmable Gain Amplifier, the first Programmable Gain Amplifier is coupled to the mixer, the mixer is coupled to the second Programmable Gain Amplifier, the second Programmable Gain Amplifier is coupled to the Low Pass Filter, the Low Pass Filter is coupled to the A/D converter, and the A/D converter is coupled to the digital processing circuits.

18. The system of claim 17 further comprising a MEMS inertial sensing device electrically coupled to the AGC loop circuit, the MEMS inertial sensing device including drive feedback capacitors and sense capacitors, wherein the drive feedback capacitors are coupled to the drive CSA (CSA_DRV) and the sense capacitors are coupled to the sense CSA (CSA_SNS).

19. The system of claim 18 further comprising a supply regulator coupled in series to a charge pump and to the MEMS inertial sensing device.

20. The system of claim 19 wherein the CSA is a drive CSA, and further comprising a mixer coupled in series to a sense CSA and to the MEMS inertial sensing device, wherein the mixer is configured as a transmission gate and the sense capacitors are coupled to the sense CSA.

21. The system of claim 18 wherein the comparator is a first comparator, and further comprising a quadrature mode circuit including a second comparator and a multiplexer, wherein the quadrature mode circuit is configured to monitor a quadrature signal from the MEMS inertial sensing device.

22. The system of claim 18 wherein the HV driver is implemented as a simple digital gate, wherein the charge pump provides a power supply to the HV driver, providing automatic gain controlled ac pulses to the MEMS inertial sensing device.

23. The system of claim 17 further comprising an on-chip temperature sensor, a programmable serial interface, a first phase shifter (PS1), and a second phase shifter (PS2); wherein PS1 and PS2 are coupled to the on-chip temperature sensor through the programmable serial interface.

24. The system of claim 17 further comprising a temperature compensation loop including an on-chip temperature sensor coupled to a programmable serial interface.

25. The system of claim 24 wherein the temperature compensation loop is used to minimize offset and drift of gyroscope measurement.

26. The system of claim 17 wherein a circuit block internal to the CMOS layer or a system software external to the CMOS layer is configured to process gyroscope measurement and temperature measurement and is configured to program phase delays first phase shifter (PS1), and a second phase shifter (PS2), a Quadrature cancellation block, and the digital processing circuits for temperature compensation.

* * * * *